(12) United States Patent
Lemonovich

(10) Patent No.: US 8,674,763 B2
(45) Date of Patent: Mar. 18, 2014

(54) MULTI-AUTONOMOUS ELECTRONIC AMPLIFIER

(75) Inventor: John E. Lemonovich, Bridgeville, PA (US)

(73) Assignee: Ansaldo STS USA, Inc., Pittsburgh, PA (US)

( * ) Notice: Subject to any disclaimer, the term of this patent is extended or adjusted under 35 U.S.C. 154(b) by 30 days.

(21) Appl. No.: 13/479,415

(22) Filed: May 24, 2012

(65) Prior Publication Data

US 2012/0299652 A1 Nov. 29, 2012

Related U.S. Application Data

(60) Provisional application No. 61/490,298, filed on May 26, 2011.

(51) Int. Cl.
*H03F 3/217* (2006.01)

(52) U.S. Cl.
USPC ........................... 330/251; 330/207 A

(58) Field of Classification Search
USPC ........................... 330/10, 251, 207 A
See application file for complete search history.

(56) References Cited

U.S. PATENT DOCUMENTS

| | | | |
|---|---|---|---|
| 4,582,279 A | 4/1986 | Pontier | |
| 5,200,930 A | 4/1993 | Rouquette | |
| 5,340,062 A | 8/1994 | Heggestad | |
| 5,633,894 A | 5/1997 | Snelgrove et al. | |
| 5,910,929 A | 6/1999 | McConnell et al. | |
| 5,995,881 A | 11/1999 | Kull | |
| 6,288,618 B1 | 9/2001 | Stevenson et al. | |
| 7,103,113 B2 | 9/2006 | Darabi | |
| 7,200,470 B2 | 4/2007 | Oguma et al. | |
| 7,221,297 B2 * | 5/2007 | Ohkuri et al. | 341/120 |
| 7,733,980 B2 | 6/2010 | Beukema et al. | |
| 7,782,129 B2 * | 8/2010 | Mallinson et al. | 330/10 |
| 7,812,666 B2 | 10/2010 | Chieng et al. | |
| 7,850,127 B2 | 12/2010 | Lemonovich et al. | |
| 8,482,346 B2 * | 7/2013 | Stanley | 330/10 |
| 2005/0249037 A1 | 11/2005 | Kohn et al. | |
| 2007/0260293 A1 | 11/2007 | Carpenter et al. | |
| 2010/0039287 A1 | 2/2010 | Li | |
| 2010/0061439 A1 | 3/2010 | Tomlinson et al. | |
| 2011/0011985 A1 | 1/2011 | Hogan | |

OTHER PUBLICATIONS

International Rectifier, Application Note AN-1071. "Class D Audio Amplifier Basics". 2005, Dec. 1, 2010.
Moreno, Sergio Sanchez, "Class D Audio Amplifiers—Theory and Design". 2005. Dec. 1, 2010.
Gaalass, Eric, "Class D Audio Amplifiers: What, Why, and How". 2006. Dec. 1, 2010.

* cited by examiner

*Primary Examiner* — Henry Choe
(74) *Attorney, Agent, or Firm* — Eckert Seamans Cherin & Mellott, LLC; Phillip E. Levy

(57) ABSTRACT

An electronic amplifier includes a configurable integrated circuit device structured to synthesize at least a first signal and a second signal, scale the first signal to create a scaled first signal and scale the second signal to create a scaled second signal, create a discrete time composite signal which comprises a summation of at least the scaled first signal and the scaled second signal, create a discrete time pulse width modulated signal based on the discrete time composite signal, and generate a number of control signals based on the discrete time pulse width modulated signal. The electronic amplifier also includes a power switching stage receiving the number of control signals from the configurable integrated circuit device, wherein the number of control signals are configured to control the power switching stage, and a low pass filter coupled to an output of the power switching stage.

23 Claims, 2 Drawing Sheets

MULTI-AUTONOMOUS ELECTRONIC AMPLIFIER

CROSS-REFERENCE TO RELATED APPLICATIONS

This application claims priority under 35 U.S.C. §119(e) from provisional U.S. patent application No. 61/490,298, entitled "Multi-Autonomous FPGA-Based Class D Amplifier for Use in Audio Frequency Track Circuits" and filed on May 26, 2011, the contents of which are incorporated herein by reference.

BACKGROUND OF THE INVENTION

1. Field of the Invention

The present invention pertains to electronic amplifiers, and, in particular, to an amplifier that may be used in, for example and without limitation, a transmitter for a railroad track circuit, wherein certain amplifier functionality is implemented in a configurable integrated circuit device, such as a field programmable gate array (FPGA) or a complex programmable logic devices (CPLD).

2. Description of the Related Art

In rail signaling systems, it is often necessary to transmit several different signal types, each required for a different function, on a RR track circuit. For example, in many rail signaling systems, the following three signals are transmitted on the track circuit: (i) a modulated train detection signal that is used to detect the presence of a train in a track circuit block, (ii) a modulated cab signal that is transmitted to the train in order to communicate track status, speed command and conditions to the crew, and (iii) a modulated TWC (track warrant control) signal. Traditionally, the train detection signal and the cab signal may have used, for example and without limitation, an ASK modulation scheme, FSK modulation scheme, an Impulse modulation scheme, or some other proprietary or non-proprietary modulation scheme, and the TWC signal was an FSK modulated signal. However, more recently, binary frequency shift keying (BFSK) digital train detection incorporating track ID, which employs a BFSK modulated train detection signal, is becoming widely accepted as being much more secure than legacy modulated carrier detection. There is thus a desire to migrate/upgrade to such systems where possible.

Thus, as the signaling equipment of many transit authorities becomes obsolete, a large market opportunity exists for replacing legacy equipment with new technology that uses the secure BFSK modulated digital train detection just described or some other new and/or different modulation scheme. However, it is typically only feasible to replace equipment incrementally, and therefore a real technical challenge arises as to how to transmit and decode digital secure train detection signals while simultaneously transmitting a distinct and different legacy cab signal and/or legacy TWC signal such that the train detection signal equipment can be upgraded first while still supporting the legacy cab and TWC signals until the cab is upgraded at a later time. By this method, transit authorities can slowly migrate to a new platform by focusing on updating ground equipment first, and converting cab equipment at a later time. This is only possible, however, if multiple signals (train detection, cab signaling and TWC signaling) can be simultaneously and independently transmitted over a single twisted pair of wire.

One way of doing so using prior art technology would involve the use of a transmitter employing three separate Class AB linear amplifiers, one for each signal. However, as is known in the art, a Class AB amplifier is relatively large and has a maximum theoretical efficiency of 78% (in practice, approximately 50% is typical with low distortion). Thus, a solution employing multiple separate Class AB linear amplifiers as just described would not be efficient and would have a very large physical size.

There is thus a need for an amplifier solution wherein multiple signals (e.g., train detection, cab signaling and TWC signaling) can be simultaneously and independently transmitted over a single twisted pair of wire that is both efficient and minimally sized.

SUMMARY OF THE INVENTION

In one embodiment, an electronic amplifier is provided that includes a configurable integrated circuit device structured to (i) synthesize at least a first signal and a second signal, (ii) scale the first signal to create a scaled first signal and scale the second signal to create a scaled second signal, (iii) create a discrete time composite signal which comprises a summation of at least the scaled first signal and the scaled second signal, (iv) create a discrete time pulse width modulated signal based on the discrete time composite signal, and (v) generate a number of control signals based on the discrete time pulse width modulated signal. The electronic amplifier also includes a power switching stage (e.g., a Class D high power switching stage) receiving the number of control signals from the configurable integrated circuit device, wherein the number of control signals are configured to control the power switching stage, and a low pass filter coupled to an output of the power switching stage.

In another embodiment, a method of generating an amplified signal is provided that includes synthesizing at least a first signal and a second signal in a configurable integrated circuit device, scaling the first signal to create a scaled first signal and scale the second signal to create a scaled second signal in the configurable integrated circuit device, creating a discrete time composite signal in the configurable integrated circuit device, wherein the discrete time composite signal comprises a summation of at least the scaled first signal and the scaled second signal, creating a discrete time pulse width modulated signal in the configurable integrated circuit device based on the discrete time composite signal, generating a number of control signals in the configurable integrated circuit device based on the discrete time pulse width modulated signal, controlling a power switching stage based on the number of control signals and outputting a first output signal from the power switching stage, and providing the first output signal to a low pass filter and outputting a second output signal from the low pass filter.

These and other objects, features, and characteristics of the present invention, as well as the methods of operation and functions of the related elements of structure and the combination of parts and economies of manufacture, will become more apparent upon consideration of the following description and the appended claims with reference to the accompanying drawings, all of which form a part of this specification, wherein like reference numerals designate corresponding parts in the various figures. It is to be expressly understood, however, that the drawings are for the purpose of illustration and description only and are not intended as a definition of the limits of the invention.

DETAILED DESCRIPTION OF EXEMPLARY EMBODIMENTS

Figure 1:
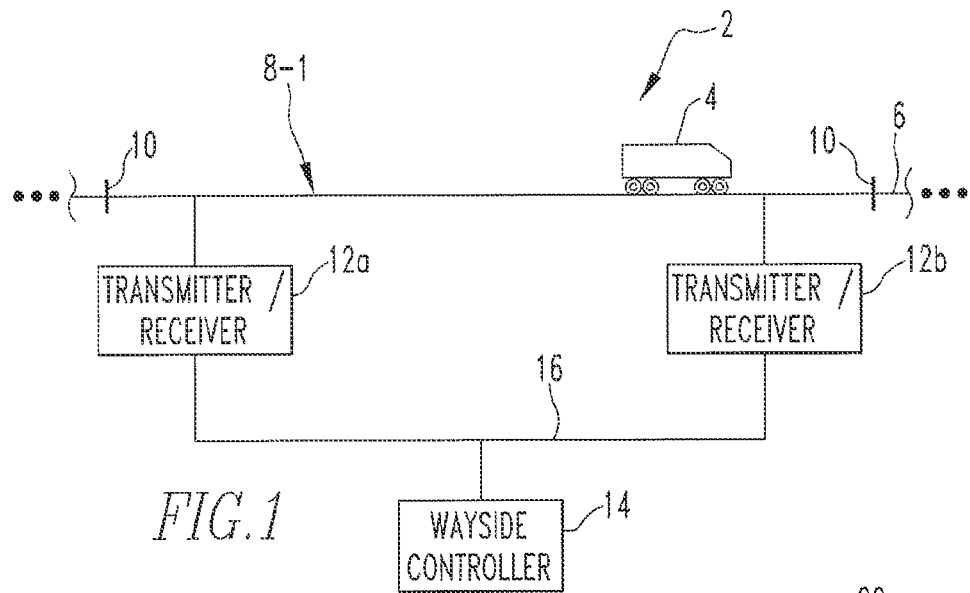
FIG. 1 is a schematic diagram of a rail signaling system in accordance with an embodiment of the present invention.

As used herein, the singular form of "a", "an", and "the" include plural references unless the context clearly dictates otherwise. As used herein, the statement that two or more parts or components are "coupled" shall mean that the parts are joined or operate together either directly or indirectly, i.e., through one or more intermediate parts or components, so long as a link occurs. As used herein, "directly coupled" means that two elements are directly in contact with each other. As used herein, "fixedly coupled" or "fixed" means that two components are coupled so as to move as one while maintaining a constant orientation relative to each other.

As used herein, the word "unitary" means a component is created as a single piece or unit. That is, a component that includes pieces that are created separately and then coupled together as a unit is not a "unitary" component or body. As employed herein, the statement that two or more parts or components "engage" one another shall mean that the parts exert a force against one another either directly or through one or more intermediate parts or components. As employed herein, the term "number" shall mean one or an integer greater than one (i.e., a plurality).

Directional phrases used herein, such as, for example and without limitation, top, bottom, left, right, upper, lower, front, back, and derivatives thereof, relate to the orientation of the elements shown in the drawings and are not limiting upon the claims unless expressly recited therein.

FIG. 1 is a schematic diagram of a rail signaling system 2 in accordance with an exemplary embodiment of the present invention wherein a modulated train detection signal, a modulated cab signal, and a modulated TWC signal can be simultaneously and independently (asynchronously) transmitted over a single twisted pair of wire. Thus, in rail signaling system 2, it is possible to transmit and decode a secure BFSK modulated digital train detection signal while simultaneously transmitting distinct and different legacy cab and TWC signals. As a result, in rail signaling system 2, the train detection signal equipment can be upgraded first while still supporting the legacy cab and TWC signals until the cab and other equipment is upgraded at a later time.

In particular, referring to FIG. 1, in order to detect the position of a train 4 traveling on a track 6, track 6 is divided into n track circuits 8 (1, 2, . . . n; track circuit 8-1 being Shown in FIG. 1) sectioned by insulator members 10. Each end of every track circuit 8 is connected to a respective transmitter/receiver device 12 (labeled 12a and 12b in FIG. 1 for track circuit 8-1) for transmitting a signal (described in greater detail herein) to and receiving the signal from the associated track circuit 8, the signal being used to communicate the modulated train detection signal, the modulated cab signal, and the modulated TWC signal as described herein. Each of the transmitter/receiver devices 12 is also connected to a wayside controller 14 through a network 16.

In operation, transmitter/receiver device 12a transmits, in the composite manner described in detail herein, the secure BFSK modulated digital train detection signal on track 6 in track circuit 8-1 to be received by transmitter/receiver device 12b. If train 4 is located in track circuit 8-1, no signal will be received by transmitter/receiver device 12b, as train 4 will shunt track circuit 8-1. If however, train 4 is not located in track circuit 8-1, the signal will be received by transmitter/receiver device 12b. As is known, the train detection signal is modulated in a secure manner in order to ensure that it can be determined to be legitimate, as opposed to being a signal that is generated by interference or from some other source. In addition, transmitter/receiver device 12a also transmits, in the composite manner described in detail herein, the modulated cab signal and the modulated TWC signal on track 6 in track circuit 8-1 to be received by pickups on train 4 if it is present in track circuit 8-1.

Figure 2:
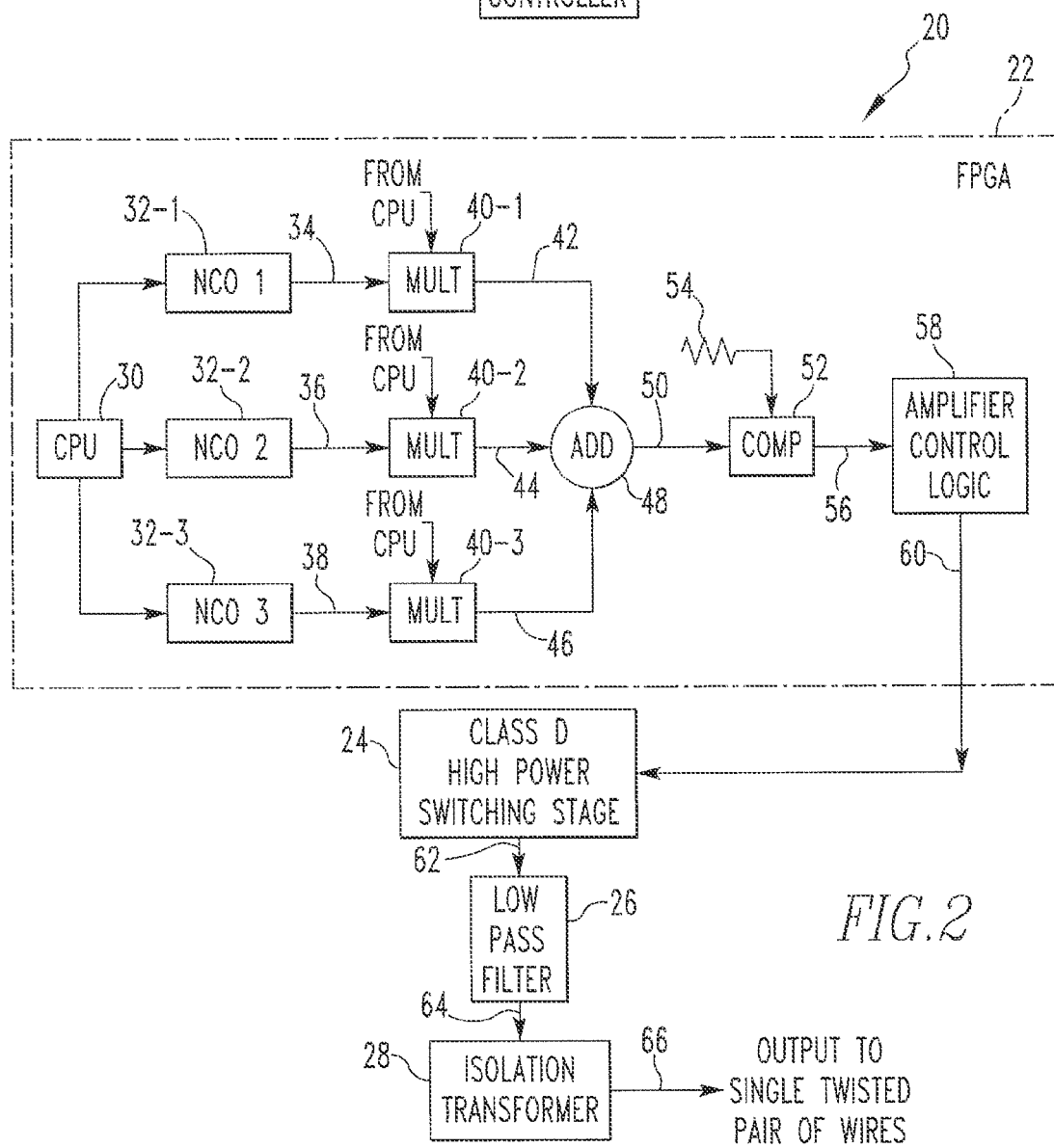
FIG. 2 is a schematic diagram of an amplifier that is employed in a transmitter/receiver device of the rail signaling system of FIG. 1 according to one particular embodiment of the present invention.

FIG. 2 is a schematic diagram of an amplifier 20 that is employed in transmitter/receiver device 12 of rail signaling system 2 according to one particular embodiment of the present invention. As described in greater detail herein, amplifier 20 is structured to generate and transmit simultaneously and independently (asynchronously) over a single twisted pair a modulated train detection signal (a BFSK secure train detection signal in the illustrated, non-limiting embodiment), a modulated cab signal (a legacy ASK modulated cab signal in the illustrated, non-limiting embodiment), and a modulated TWC signal (a legacy FSK modulated TWC signal in the illustrated, non-limiting embodiment). As described in greater detail below, amplifier 20 is a solution that enables multiple different signal types to be transmitted simultaneously and independently (asynchronously) by employing Class D amplifier technology wherein the Class D amplifier is not implemented as a complete hardware solution, but rather wherein certain Class D amplifier functionality is implemented in a single configurable integrated circuit device, such as a field programmable gate array (FPGA) or a complex programmable logic devices (CPLD). For illustrative purposes, the present invention is described as using an FPGA. It will be understood, however, that that is not meant to be limiting and that other suitable configurable integrated circuit devices may also be employed.

As is known in the art, a Class-D amplifier is an electronic switching amplifier where all power devices (e.g., usually MOSFETs) are operated as binary switches which are either fully on or fully off with nearly zero time spent transitioning between those two states, Class-D amplifiers are capable of much higher power efficiency than equivalent linear Class A/B/AB amplifiers. In particular, a Class AB amplifier has a maximum theoretical efficiency of 78%, and in practice only approximately 50% efficiency is typical with low distortion. In contrast, a Class D amplifier has a theoretical efficiency of 100%, while efficiencies of greater than 90% are attainable in practice, especially in higher power amplifiers with certain load conditions. Also, due to the high efficiency, the physical size of a Class D amplifier is much smaller than a linear amplifier counterpart.

A typical Class D amplifier consists of four main stages implemented in the prior art by solid state hardware components. The first stage creates a high speed pulse width modulated (PWM) composite signal by comparing a continuous-time variable amplitude input signal to a precision high speed sawtooth wave using a high speed synchronous comparator. The output of the comparator is essentially a discrete time sampled PWM signal at a frequency that is much higher than the input signal (the frequency of the sawtooth signal is the sampling rate and therefore must follow the Nyquist Theorem). Alternatively, the output may be a continuous-time PWM signal in a complete analog implementation without the synchronous comparator.

The second stage of a Class D amplifier is a high power switching stage. As used herein, the term "power switching stage" shall mean a stage of circuitry which uses switch devices (such as MOSFETs) capable of voltages and currents well beyond digital logic voltages and currents (i.e.: tens or hundreds of volts and several amps . . . as opposed to mA or uA and voltages less then 3V) and an independent source voltage to amplify the input signal for transmission over a long distance such as hundreds of feet or even miles, and the term "high power switching stage" shall mean a tens or hundreds of Watts of power delivery, as opposed to digital logic/hardware capable of mW of power. In a Class D amplifier, the high power switching stage typically consists of a DC power supply, either a full or half bridge MOSFET (or other electronic switching device) configuration, and a number of integrated circuit (IC) devices that control and monitor the bridge configuration.

The third stage of a Class D amplifier is a low pass filter. The purpose of the low pass filter stage is to reject the high frequency component of the signal (from the sawtooth sampling rate) and leave the amplified version of the original input signal. Typically, the low pass filter stage is implemented with passive components (e.g., an LC filter) in order to support high voltage and current, while maintaining efficiency.

The fourth stage of a Class D amplifier is a negative feedback stage that is a closed-loop control system responsible for correcting the output by adjusting the input based on summation of the feedback signal and the input signal (leaving the error signal). This process creates a precise low distortion output that is load independent in terms of load impedance (not in frequency response). There is, however, a large drawback to this control loop in a safety critical application such as driving a track circuit. In particular, a single point hardware failure has the capability of creating a large error signal and excessive over-amplification of a signal, which is an unsafe fault. The only feasible means to mitigate this failure mode is by diagnostics/testing of the feedback circuit itself. In a track circuit application (such as the exemplary, non-limiting embodiment described herein, i.e., a track circuit transmitter), the feedback stage is likely not worth the added complexity, given that the load for the track circuit transmitter is relatively fixed and the failure mode introduced is an undetected safety-critical fault. In a more typical, pure audio non-safety critical application, for example, where a speaker is the load and may be 4 ohms or 8 ohms, this function is critical to maintain constant power delivery.

Referring again to FIG. 2, amplifier 20 in the exemplary embodiment includes an FPGA 22 (although, as described elsewhere herein, another type of configurable integrated circuit device, such as a CPLD, may also be used), a Class D high power switching stage 24, a low pass filter 26, and an isolation transformer 28.

FPGA 22 includes an embedded CPU (central processing unit) 30. CPU 30 is structured and programmed to parameterize (i.e., create and output the parameters which define and describe how to generate the signals) the multiple signals that are synthesized and transmitted by amplifier 20 as described herein. In the illustrated, non-limiting exemplary embodiment, CPU 30 is structured and programmed to parameterize the BFSK secure train detection signal, the ASK cab signal and the FSK TWC signal. As seen in FIG. 2, FPGA 22 further includes first, second and third embedded numerically controlled oscillators (NCOs) 32-1, 32-2, and 32-3. NCO 32-1 receives the paramertization information from CPU 30 that relates to the BFSK secure train detection signal and synthesizes (in digital form) the BFSK secure train detection signal, indicated by reference numeral 34 in FIG. 2. NCO 32-2 receives the paramertization information from CPU 30 that relates to the ASK cab signal and synthesizes (in digital form) the ASK cab signal, indicated by reference numeral 36 in FIG. 2. NCO 32-3 receives the paramertization information from CPU 30 that relates to the FSK TWC signal and synthesizes (in digital form) the FSK TWC signal, indicated by reference numeral 38 in FIG. 2.

As seen in FIG. 2, FPGA 22 also includes first, second and third embedded multiplier blocks 40-1, 40-2 and 40-3. Multiplier block 40-1 receives the BFSK secure train detection signal 34 and scales (i.e., adjusts the power of) that signal based on an output from CPU 30 to create a scaled BFSK secure train detection signal 42. Multiplier block 40-2 receives the ASK cab signal 36 and scales (i.e., adjusts the power of) that signal based on an output from CPU 30 to create a scaled ASK cab signal 44. Finally, multiplier block 40-3 receives the FSK TWC signal 36 and scales (i.e., adjusts the power that signal based on an output from CPU 30 to create a scaled FSK TWC signal 46. Thus, in the illustrated embodiment, the magnitude of each synthesized signal is controlled by a multiplier-based pre-scalar.

FPGA 22 further includes an embedded adder block 48. Adder block 48 receives scaled BFSK secure train detection signal 42, scaled ASK cab signal 44, and scaled FSK TWC signal 46 as inputs and outputs a discrete time composite signal 50, which is a summation of the three input signals. As seen in FIG. 2, FPGA 22 also includes an embedded comparator block 52. The inputs into comparator block 52 are the discrete time composite signal 50 and a precision high frequency sawtooth sampling waveform 54 generated by FPGA 22 based on a ROM-LUT (Look Up Table) and its own scaling logic (to get it to the proper amplitude that represents a full scale composite signal). Comparator block 52 outputs a discrete time PWM signal 56. In the exemplary embodiment, the sampling rate of sawtooth sampling waveform 54 is at least 10-15 times higher than the frequency of discrete time composite signal 50 to ensure that discrete time composite signal 50 will be sufficiently represented with low distortion.

Discrete time PWM signal 56 is input into amplifier control logic block 58 of FPGA 22. Amplifier control logic block 58 is structured to generate a number of signals 60 that, as represented in FIG. 2, drive the gate driver ICs of Class D high power switching stage 24. In particular, amplifier control logic block 58 controls the ON/OFF timing of each of the two, or four MOSFETs (depending on full or half-bridge) to allow enough deadtime in order to maintain power efficiency. The ON/OFF control delay times can be controlled down to about 5 nano-second resolution to allow precise control. There is also some amplifier power delivery feedback as well as Over Voltage and Over Current Protection (OVP/OCP) implemented in amplifier control logic block 58.

Figure 3:
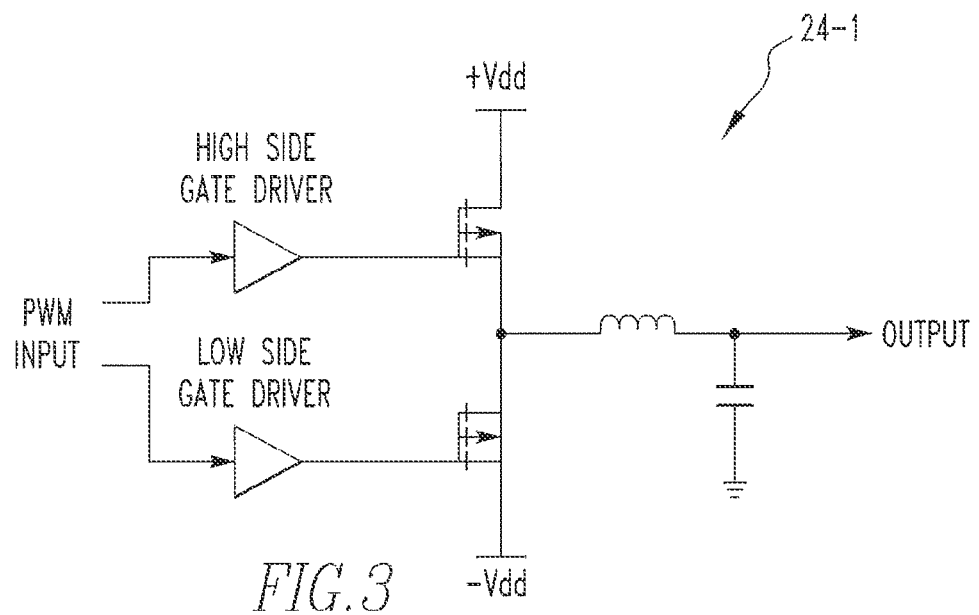
FIG. 3 is a schematic diagram of a half bridge power switching stage topology that may be used in the amplifier of FIG. 2.

In one embodiment, Class D high power switching stage 24 is implemented (outside of FPGA 22) in the form of a half bridge topology shown in FIG. 3 (labeled 24-1). In another, alternative embodiment, Class D high power switching stage 24 is implemented (outside of FPGA 22) in the form of a full bridge topology shown in FIG. 4 (labeled 24-2). The relative advantages and disadvantages of each implementation are discussed elsewhere herein. It is important to note that Class D high power switching stage 24 must be carefully designed to maintain tight control of the MOSFETs and for monitoring to protect amplifier 20 from failure due to excessive loading or accidental shorting. In addition, precise control of the MOSFETs and the associated dead time as described above is critical for maintaining efficiency.

Referring again to FIG. 2, the analog output signal 62 of Class D high power switching stage 24 is input into low pass filter 26. Low pass filter 26 has a predetermined corner frequency (e.g. 50 kHz) and rejects the high frequency component of analog output signal 62 (which comes from the sampling rate of sawtooth sampling waveform 54) and outputs an analog filtered output signal 64, which is an analog amplified version of discrete time composite signal 50. The analog filtered output signal 64 is input into isolation transformer 28 which provides a voltage isolation function. The output 66 is then provided to a single twisted pair of wire for transmission on a track circuit 8 as described herein.

Given the speed of the synchronous FPGA 22, the MOSFET-bridge and dead time control of Class D high power switching stage 24 can, in one embodiment, be controlled with resolution of about 5 ns. In addition, carrier signals (the BFSK secure train detection signal, the ASK cab signal and the FSK TWC signal) can, in one embodiment, be generated with the following frequency resolution: assuming a 32-bit phase accumulator increment and 100 MHz clock; Fres= (fclk/$2^M$) where Fclk is core frequency and M is the accumulator width in bits; Fres=0.023 Hz. Assuming the modulation code rates/bit rates are counter-based and are generated inside FPGA 22 using the same 100 MHz clock, the code rate/modulation bit rate is generated with +/−10 ns resolution. The modulation/code rate generation accuracy is given as: [(1/FCLK)/(1/modulation rate (Hz))]. For example, with a 200 bps modulation bit rate the accuracy is 0.0002%.

In addition, one drawback to the summation of N signals inside FPGA 22 and transmission via a single Class D amplifier is that the summed signal must not exceed the magnitude of the sawtooth waveform (for proper representation) and therefore each of the IN audio signals must have its maximum amplitude scaled (divided) by N. This is significant because the power output reduces proportionally by the square of the voltage ($V^2$/R). The only method of compensation for this is to increase the DC supply rail voltage equivalently as the number of signals summed inside FPGA 22. For example, if one signal using 50 VDC can produce 100 W into a given load, then the addition of a second signal will require 100 VDC to produce the same 100 W into the same load. This makes component selection very difficult, particularly the MOSFETs and driver IC for Vds breakdown voltage and gate charge.

In initial testing of the present invention, the inventor employed a half bridge topology (FIG. 3) in Class D high power switching stage 24, mainly because such a topology requires less components and therefore has less losses and a higher efficiency. A drawback to this topology is the requirement of positive and negative DC supplies. In addition, the half bridge topology requires very well balanced DC supplies to maintain efficiency, especially when transformer coupling is employed. Since transformers do not respond well to a DC-bias, any dissymmetry in the regulation of the supplies was found to have an adverse effect on overall efficiency. Another drawback to the half bridge topology is the "bus pumping" effect on the supplies. Which worsens with lower load impedances. Through testing, the inventor was able to determine that this pumping effect had adverse effects on the power supply regulation, which worsened the symmetry issue as well.

Figure 4:
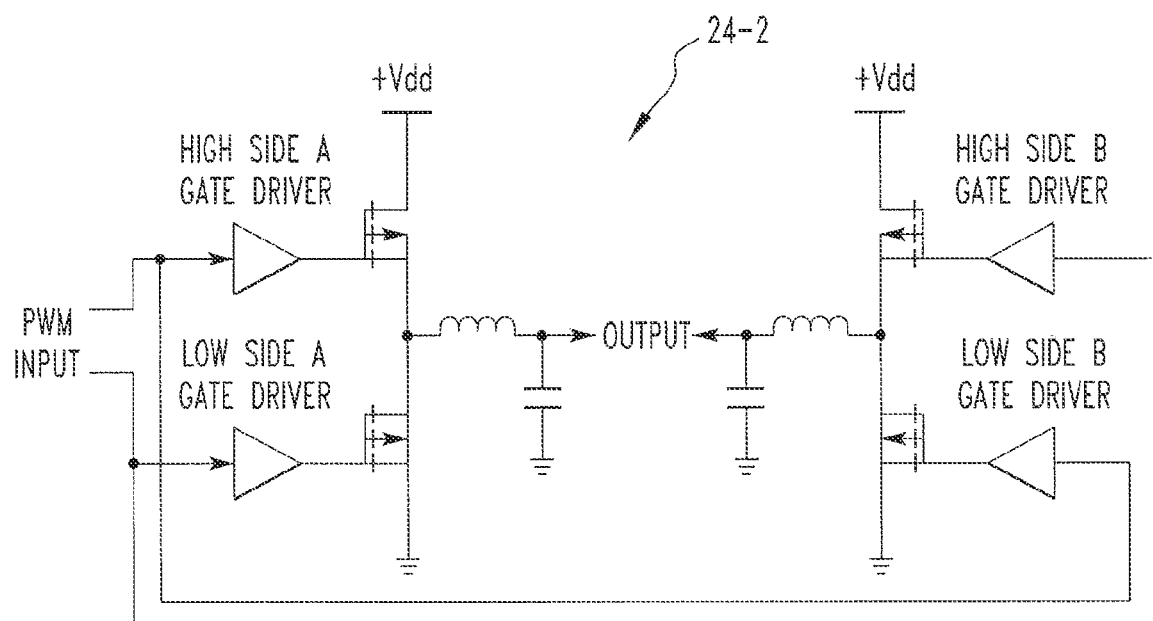
FIG. 4 is a schematic diagram of a full bridge power switching stage topology that may be used in the amplifier of FIG. 2.

The problems presented by the half bridge topology lead the inventor to test a version of the invention that employed a full bridge topology (FIG. 4). Such an implementation, while in theory being less efficient due to the increase in switching losses from double the MOSFETs, was determined to be easier to implement from a design perspective. First, the requirement of only a single DC supply eliminates the need for perfect symmetry between positive and negative supplies. Also, the full bridge overall efficiency was found to be higher than the half bridge overall efficiency due to the lower DC bias at isolation transformer 28. One negative with the full bridge topology is the higher component count with double the MOSFETs/control circuitry and twice the components on the output low pass filter 26. However, this is more than compensated for by no longer requiring the negative DC supply.

Furthermore, in initial testing, it was difficult to achieve over 80% efficiency. It was determined that the largest contributor to losses was not the conductive or switching power losses of Class D high power switching stage 24, but instead the output low pass filter 26. The total power losses in a Class D amplifier are given as P(losstotal)=P(switching)+P(conductive)+P(gd), where P(conductive) is the $I^2R$ losses and the total switching power losses are given as: Pgd(gate drive losses)=2*Qg*Vgs*fpwm; Psw(switching losses)= Coss*Vbus$^2$*fpwrn+Id*Yds*fpm. As can be seen from the individual terms of the above equations, the total losses incurred are very specific to the implementation, specifically the MOSFETs and the drive circuitry in Class D high power switching stage 24, Testing has showed that these losses account for about 5-8% of the total loss, leaving about 10% of the loss in the low pass filter 26. While an LC filter is theoretically lossless, the core losses in practice seem to vary widely. Because core materials and associated losses are not well categorized by manufacturers, the inventor empirically tested a variety of LC filter combinations for use as low pass filter 26. The capacitor is not as critical and therefore can be chosen secondary to the inductor. The inductor selection is paramount to overall efficiency of amplifier 20, especially when transformer coupling is employed as in the exemplary embodiment. After testing many inductor types, the inductor of choice in one embodiment was a Coilcraft SER2918H. In this embodiment, the LC filter implemented as low pass filter 26 alone contributed to an increase in efficiency of about 1.0%.

One vital key in maintaining efficiency when applying the amplifier to an audio frequency track circuit is ensuring the transformer coupling is appropriate in terms of reflected impedance back to the amplifier. Since a track circuit may be thousands of feet from the amplifier, a higher voltage transmission is necessary to avoid high conductive power losses in the transmission line. Transformer coupling can be tricky given that the reflected impedance goes up or down by the square of the turns ratio, and depending on the load (wL) of the transmit or receive loop within the bond, the ratio of the transformer at the amplifier and at the coupling unit should be designed to ensure the amplifier does not see a lower load than 8 ohms. This is because the output impedance (mainly due to the R(dson) of the MOSFETs chosen) of the amplifier is around 0.3 ohms and 0.3 ohms is 3.75% of an 8 ohm load and the maximum theoretical efficiency into an 8 ohm load is 96.25% and this decreases with lower loads. If a lower impedance load is desired (such as 4 ohms), MOSFETs with lower R(dson) must be chosen, but typically the R(dson) is directly proportional to the V(ds) breakdown voltage and therefore the DC supply voltage must be decreased as well.

Amplifier 20 as described herein thus provides a solution wherein multiple different and distinct signals (e.g., a modulated train detection signal, a modulate cab signal and a modulated TWC signal) may be generated and transmitted simultaneously and independently (asynchronously) over a single twisted pair. In addition, implementing amplifier 20 with FPGA technology has several substantial benefits as compared to a complete solid state hardware solution. First, the speed of the synchronous FPGA logic provides for precision generation of the signal carriers and modulation rates, and also provides for precise control of the MOSFET driver ICs of the power switching stage and the associated dead time (to prevent shoot through). The high speed discrete time processing inside the FPGA also alleviates the burden of having to match components (and therefore match timing) to achieve high efficiency. Another benefit is reduced physical size. Class D amplifiers in general are considerably smaller than a traditional linear Class AB amplifier, but an even smaller footprint is made possible by the present invention by incorporating the signal synthesis, magnitude control, PWM generation and MOSFET bridge control (including dead time control) into FPGA 22. In many applications, an FPGA is already present to provide other mixed signal processing functions or to provide a CPU. Adding the Class D functionality as described herein is a relatively low resource addition that can typically fit into an FPGA that is already present in the application's hardware design. Still another significant and unexpected benefit of the present invention is that, as discussed in detail elsewhere herein, amplifier 20, by enabling the simultaneous transmission of distinct and different signals on a single twisted pair, amplifier 20 thereby enables multi-signal type equipment, such as train detection signal equipment, to be upgraded in stages because both new and legacy signal types can be supported at the same time.

Furthermore, while the present invention has, in the illustrated embodiment, been described in connection with a transmitter device for a railroad track circuit signaling system, it will be understood that that is meant to be exemplary only, and that the present invention may be employed in any application requiring the transmission of multiple distinct and different signals (e.g., modulated or steady carrier, high power or low power) or where a spread-spectrum type signal is required which requires the simultaneous transmission of N different frequencies (such as Orthogonal Frequency Division Multiplexing OFDM).

In the claims, any reference signs placed between parentheses shall not be construed as limiting the claim. The word "comprising" or "including" does not exclude the presence of elements or steps other than those listed in a claim. In a device claim enumerating several means, several of these means may be embodied by one and the same item of hardware. The word "a" or "an" preceding an element does not exclude the presence of a plurality of such elements. In any device claim enumerating several means, several of these means may be embodied by one and the same item of hardware. The mere fact that certain elements are recited in mutually different dependent claims does not indicate that these elements cannot be used in combination.

Although the invention has been described in detail for the purpose of illustration based on what is currently considered to be the most practical and preferred embodiments, it is to be understood that such detail is solely for that purpose and that the invention is not limited to the disclosed embodiments, but, on the contrary, is intended to cover modifications and equivalent arrangements that are within the spirit and scope of the appended claims. For example, it is to be understood that the present invention contemplates that, to the extent possible, one or more features of any embodiment can be combined with one or more features of any other embodiment.

What is claimed is:

1. An electronic amplifier, comprising:
   a configurable integrated circuit device structured to (i) synthesize at least a first signal and a second signal, wherein the configurable integrated circuit device includes a CPU, a first numerically controlled oscillator and a second numerically controlled oscillator, wherein the first numerically controlled oscillator is structured to synthesize the first signal based on one or more first parameters generated by the CPU and wherein the second numerically controlled oscillator is structured to synthesize the second signal based one or more second parameters generated by the CPU, (ii) scale the first signal to create a scaled first signal and scale the second signal to create a scaled second signal, (iii) create a discrete time composite signal which comprises a summation of at least the scaled first signal and the scaled second signal, (iv) create a discrete time pulse width modulated signal based on the discrete time composite signal, and (v) generate a number of control signals based on the discrete time pulse width modulated signal;
   a power switching stage receiving the number of control signals from the configurable integrated circuit device, wherein the number of control signals are configured to control the power switching stage; and
   a low pass filter coupled to an output of the power switching stage.

2. The electronic amplifier according to claim 1, wherein the configurable integrated circuit device is a field programmable gate array or a complex programmable logic device.

3. The electronic amplifier according to claim 1, wherein the power switching stage is a Class D high power switching stage.

4. The electronic amplifier according to claim 3, wherein the Class D high power switching stage includes a DC power supply, a full or half bridge electronic switching device configuration, and one or more gate driver integrated circuit devices that control and monitor the full or half bridge electronic switching device configuration, and wherein the number of control signals drive the one or more gate driver integrated circuit devices.

5. The electronic amplifier according to claim 1, wherein the configurable integrated circuit device is structured to synthesize a third signal, scale the third signal to create a scaled third signal and create a discrete time composite signal which comprises a summation of at least the scaled first signal, the scaled second signal and the scaled third signal.

6. The electronic amplifier according to claim 1, wherein the first signal is a first modulated signal and the second signal is a second modulated signal.

7. The electronic amplifier according to claim 6, wherein the electronic amplifier is part of a transmitter device for a railroad signaling system, and wherein the first modulated signal is a train detection signal and the second modulated signal is a cab signal.

8. The electronic amplifier according to claim 7, wherein the train detection signal is a secure BFSK signal and the cab signal is an ASK signal.

9. The electronic amplifier according to claim 1, wherein the configurable integrated circuit device further includes a first embedded multiplier block and a second embedded multiplier block, wherein the first embedded multiplier block is structured to scale the first signal based on a first parameter generated by the CPU, and wherein the second embedded multiplier block is structured to scale the second signal based on a second parameter generated by the CPU.

10. An electronic amplifier, comprising:
a configurable integrated circuit device structured to (i) synthesize at least a first signal and a second signal, (ii) scale the first signal to create a scaled first signal and scale the second signal to create a scaled second signal, wherein the configurable integrated circuit device includes a CPU, a first embedded multiplier block and a second embedded multiplier block, wherein the first embedded multiplier block is structured to scale the first signal based on a first parameter generated by the CPU, and wherein the second embedded multiplier block is structured to scale the second signal based on a second parameter generated by the CPU, (iii) create a discrete time composite signal which comprises a summation of at least the scaled first signal and the scaled second signal, (iv) create a discrete time pulse width modulated signal based on the discrete time composite signal, and (v) generate a number of control signals based on the discrete time pulse width modulated signal;
a power switching stage receiving the number of control signals from the configurable integrated circuit device, wherein the number of control signals are configured to control the power switching stage; and
a low pass filter coupled to an output of the power switching stage.

11. The electronic amplifier according to claim 1, wherein the configurable integrated circuit device includes an embedded adder block structured to create the discrete time composite signal by summing at least the scaled first signal and the scaled second signal.

12. The electronic amplifier according to claim 1, wherein the configurable integrated circuit device includes an embedded comparator block structured to create the discrete time pulse width modulated signal based on the discrete time composite signal and a sawtooth sampling waveform.

13. The electronic amplifier according to claim 1, wherein the low pass filter is an LC filter having a predetermined corner frequency.

14. A transmitter device for a railroad signaling system, comprising an electronic amplifier according to claim 1.

15. A method of generating an amplified signal, comprising:
synthesizing at least a first signal and a second signal in a configurable integrated circuit device, wherein the configurable integrated circuit device includes a CPU, a first numerically controlled oscillator and a second numerically controlled oscillator, wherein the first numerically controlled oscillator synthesizes the first signal based on one or more first parameters generated by the CPU and wherein the second numerically controlled oscillator synthesized the second signal based one or more second parameters generated by the CPU;
scaling the first signal to create a scaled first signal and scaling the second signal to create a scaled second signal in the configurable integrated circuit device;
creating a discrete time composite signal in the configurable integrated circuit device, wherein the discrete time composite signal comprises a summation of at least the scaled first signal and the scaled second signal;
creating a discrete time pulse width modulated signal in the configurable integrated circuit device based on the discrete time composite signal;
generating a number of control signals in the configurable integrated circuit device based on the discrete time pulse width modulated signal;
controlling a power switching stage based on the number of control signals and outputting a first output signal from the power switching stage; and
providing the first output signal to a low pass filter and outputting a second output signal from the low pass filter.

16. The method according to claim 15, wherein the configurable integrated circuit device is a field programmable gate array or a complex programmable logic device.

17. The method according to claim 15, wherein the power switching stage is a Class D high power switching stage.

18. The method according to claim 17, wherein the Class D high power switching stage includes a DC power supply, a full or half bridge electronic switching device configuration, and one or more gate driver integrated circuit devices that control and monitor the full or half bridge electronic switching device configuration, and wherein the number of control signals drive the one or more gate driver integrated circuit devices.

19. The method according to claim 15, further comprising synthesizing a third signal in the configurable integrated circuit device, and scaling the third signal to create a scaled third signal in the configurable integrated circuit device, wherein the discrete time composite signal comprises a summation of at least the scaled first signal, the scaled second signal and the scaled third signal.

20. The method according to claim 15, wherein the first signal is a first modulated signal and the second signal is a second modulated signal.

21. The method according to claim 20, wherein the first modulated signal is a train detection signal and the second modulated signal is a cab signal.

22. The method according to claim 21, wherein the train detection signal is a secure BFSK signal and the cab signal is an ASK signal.

23. A method of generating an amplified signal, comprising:
synthesizing at least a first signal and a second signal in a configurable integrated circuit device;
scaling the first signal to create a scaled first signal and scale the second signal to create a scaled second signal in the configurable integrated circuit device, wherein the configurable integrated circuit device includes a CPU, a first embedded multiplier block and a second embedded multiplier block, wherein the first embedded multiplier block scales the first signal based on a first parameter generated by the CPU, and wherein the second embedded multiplier block scales the second signal based on a second parameter generated by the CPU;
creating a discrete time composite signal in the configurable integrated circuit device, wherein the discrete time composite signal comprises a summation of at least the scaled first signal and the scaled second signal;
creating a discrete time pulse width modulated signal in the configurable integrated circuit device based on the discrete time composite signal;
generating a number of control signals in the configurable integrated circuit device based on the discrete time pulse width modulated signal;
controlling a power switching stage based on the number of control signals and outputting a first output signal from the power switching stage; and
providing the first output signal to a low pass filter and outputting a second output signal from the low pass filter.

* * * * *

UNITED STATES PATENT AND TRADEMARK OFFICE
CERTIFICATE OF CORRECTION

PATENT NO.        : 8,674,763 B2
APPLICATION NO.   : 13/479415
DATED             : March 18, 2014
INVENTOR(S)       : Lemonovich Page 1 of 1

It is certified that error appears in the above-identified patent and that said Letters Patent is hereby corrected as shown below:

On the title page, Item [74] second column, line 23, "Phillip E. Levy" should read --Philip E. Levy--.

In the Specification
Column 3, line 57, "being Shown" should read --being shown--.
Column 6, line 1, "paramertization" should read --parameterization--.
Column 6, line 4, "paramertization" should read --parameterization--.
Column 6, line 8, "paramertization" should read --parameterization--.
Column 6, line 22, "power that" should read --power of) that--.
Column 7, line 35, "IN" should read --N--.
Column 7, line 59, "supplies. Which" should read --supplies, which--.
Column 8, line 18, "given as" should read --given as:--.
Column 8, line 22, "Coss*Vbus$^2$*fpwrn=Id*Yds*fpm" should read
--Coss*Vbus$^2$*fpwm+Id*Vds*tf*rpwm--.
Column 8, line 41, "1.0%" should read --10%--.

In the Claims
Column 10, line 13, claim 1, "based one" should read --based on one--.
Column 11, line 51, claim 15, "synthesized" should read --synthesizes--.
Column 11, line 52, claim 15, "based one"" should read --based on one--.

Signed and Sealed this
Seventeenth Day of June, 2014

Michelle K. Lee
*Deputy Director of the United States Patent and Trademark Office*